US012757685B2

(12) United States Patent
Zaima

(10) Patent No.: US 12,757,685 B2
(45) Date of Patent: Oct. 6, 2026

(54) SEMICONDUCTOR MANUFACTURING DEVICE, WAFER MOUNTING DEVICE, DICING DEVICE, AND SEMICONDUCTOR MANUFACTURING METHOD

(71) Applicant: Mitsubishi Electric Corporation, Tokyo (JP)

(72) Inventor: Osamu Zaima, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 127 days.

(21) Appl. No.: 18/626,297

(22) Filed: Apr. 3, 2024

(65) Prior Publication Data

US 2025/0038038 A1 Jan. 30, 2025

(30) Foreign Application Priority Data

Jul. 24, 2023 (JP) ................................ 2023-119815

(51) Int. Cl.
*H10P 72/70* (2026.01)
*H10P 72/00* (2026.01)

(52) U.S. Cl.
CPC ...... *H10P 72/7402* (2026.01); *H10P 72/0428* (2026.01); *H10P 72/0442* (2026.01); *H10P 72/7416* (2026.01)

(58) Field of Classification Search
CPC ........... H01L 21/6836; H01L 21/67092; H01L 21/67132; H01L 2221/68327; H01L 21/78
USPC ............. 438/33, 68, 113, 441, 458, 460–465
See application file for complete search history.

(56) References Cited

U.S. PATENT DOCUMENTS

2006/0169680 A1* 8/2006 Park ....................... B23K 26/40 438/460
2011/0294279 A1* 12/2011 Okamura ............ B28D 5/0029 438/460
2016/0155656 A1 6/2016 Matsumura

FOREIGN PATENT DOCUMENTS

WO 2015/056303 A1 4/2015

* cited by examiner

*Primary Examiner* — Andrew L Swanson
(74) *Attorney, Agent, or Firm* — Studebaker Brackett PLLC

(57) ABSTRACT

An object is to provide a technique capable of suppressing unevenness of force applied to a dicing blade in cutting an orientation flat. A semiconductor manufacturing device includes a stage and a transport machine. A semiconductor wafer including an orientation flat and a jig having a shape corresponding to the orientation flat to be used for cutting the orientation flat by a dicing blade are fixed to each other by a dicing tape on the stage. The transport machine transports the jig so that the jig faces the orientation flat on the stage.

13 Claims, 3 Drawing Sheets

SEMICONDUCTOR MANUFACTURING DEVICE, WAFER MOUNTING DEVICE, DICING DEVICE, AND SEMICONDUCTOR MANUFACTURING METHOD

BACKGROUND OF THE INVENTION

Field of the Invention

The present disclosure relates to a semiconductor manufacturing device, a wafer mounting device, a dicing device, and a semiconductor manufacturing method.

Description of the Background Art

In manufacturing a semiconductor device, a semiconductor chip cut out from a semiconductor wafer by a dicing device is generally mounted on a semiconductor module. When a semiconductor wafer is cut by a dicing device, the semiconductor wafer is stuck to a dicing tape so that the semiconductor chip does not move (for example, International Publication No. 2015/056303).

SUMMARY

An orientation flat as a cutout for adjusting a position and a rotation angle of the semiconductor wafer is provided to the semiconductor wafer in many cases, and there is a case where the dicing device cuts the orientation flat along the orientation flat having a straight shape depending on a design of the semiconductor chip. In this case, one surface of a plate-like dicing blade cutting the orientation flat receives force from the semiconductor wafer, however, the other surface thereof is located adjacent to a space and does not receive the force, thus uneven force is applied to the dicing blade. As a result, the dicing blade is easily broken, and there is a problem that defect such as decrease in lifetime of the dicing blade occurs, for example.

The present disclosure therefore has been made to solve the above problems, and it is an object of the present disclosure to provide a technique capable of suppressing unevenness of force applied to a dicing blade in cutting an orientation flat.

A semiconductor manufacturing device according to the present disclosure includes: a stage on which a semiconductor wafer including an orientation flat and a jig having a shape corresponding to the orientation flat to be used for cutting the orientation flat by a dicing blade are fixed to each other by a dicing tape; and a transport machine transporting the jig so that the jig faces the orientation flat on the stage.

Unevenness of force applied to the dicing blade can be suppressed in cutting the orientation flat.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
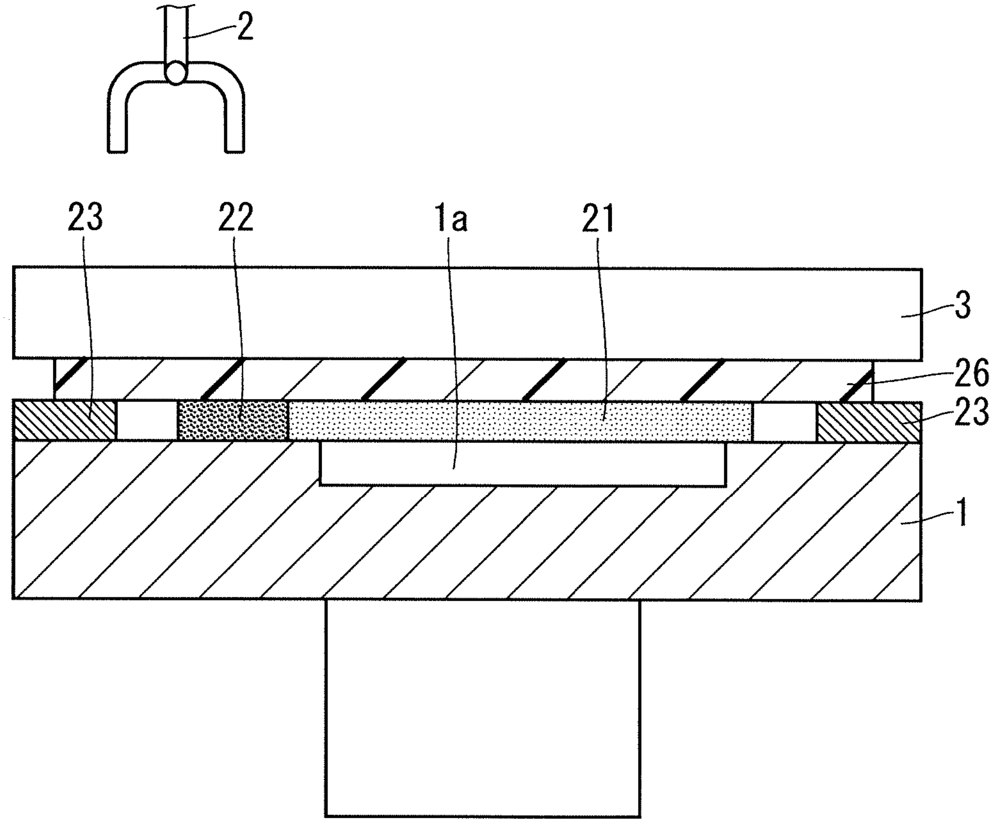
FIG. 1 is a schematic cross-sectional view illustrating a configuration of a wafer mounting device according to an embodiment 1.

Embodiments are described with reference to the appended diagrams hereinafter. Features described in each embodiment described below is exemplification, thus all features are not necessarily applied. The same or similar reference numerals will be assigned to same or similar constituent elements in a plurality of embodiments in the description hereinafter, and the different constituent elements are mainly described hereinafter. A specific position and direction such as "upper side", "lower side", "left", "right", "front side", or "back side", for example, may not necessarily coincide with a position and direction in an actual implementation in the description hereinafter.

Embodiment 1

FIG. 1 is a schematic cross-sectional view illustrating a configuration of a wafer mounting device including a semiconductor manufacturing device according to the present embodiment 1. The semiconductor manufacturing device of the wafer mounting device in FIG. 1 includes a wafer table 1 as a stage and a transport machine 2. The wafer mounting device in FIG. 1 includes not only the semiconductor manufacturing device but also a sticking roller 3 as a tape sticking part.

Figure 2:
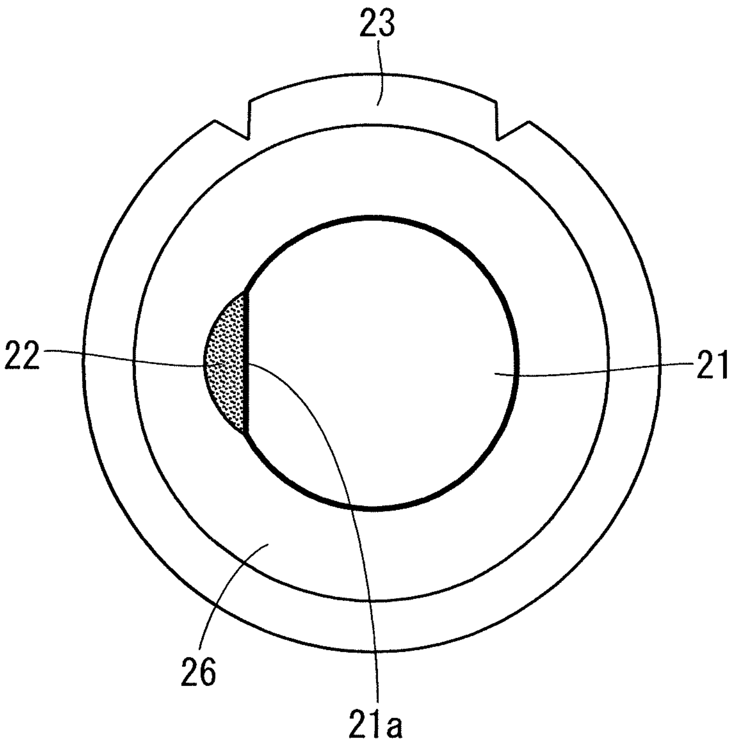
FIG. 2 is a plan view illustrating an example of a structure to be cut.

The wafer table 1 is a stage on which a semiconductor wafer 21 and a jig 22 are fixed to each other by a dicing tape 26. In the present embodiment 1, the semiconductor wafer 21, the jig 22, and a wafer ring 23 are mounted on the wafer table 1, and then stuck to the dicing tape 26. FIG. 2 is a plan view illustrating an example of a structure to be cut in which the semiconductor wafer 21, the jig 22, and the wafer ring 23 are stuck to the dicing tape 26. The semiconductor wafer 21 in the structure to be cut is cut by a dicing device as described hereinafter.

The semiconductor wafer 21 includes an orientation flat 21*a*. Provided to the semiconductor wafer 21 is a semiconductor chip including at least one of a metal oxide semiconductor field effect transistor (MOSFET), an insulated gate bipolar transistor (IGBT), a reverse conducting IGBT (RC-IGBT), a Schottky barrier diode (SBD), and a PN junction diode (PND). In the present specification, for example, at least any one of A, B, C, • • •, and Z indicates any one of all of combinations extracting from one or more of groups of A, B, C, • • •, and Z.

The semiconductor wafer 21 may be made of normal silicon (Si), or may also made of wide bandgap semiconductor such as silicon carbide (SiC), gallium nitride (GaN), or diamond. When the semiconductor wafer 21 is made up of a wide bandgap semiconductor, a stable operation under high temperature and high voltage and increase in switching speed can be achieved.

The wafer table 1 is provided with a depression 1*a*, and the semiconductor wafer 21 is mounted on the wafer table 1 manually or by the transport machine 2 or the other transport machine so that only an outer surrounding of the semiconductor wafer 21 is supported by the wafer table 1. The depression 1*a* suppresses contact between a surface structure of the semiconductor chip provided to the semiconductor wafer 21 and the wafer table 1.

The jig 22 in FIG. 2 is a jig having a shape corresponding to the orientation flat 21*a* and used to cut the orientation flat 21*a* by a dicing blade. In the example in FIG. 2, a right side part of the jig 22 has a straight shape corresponding to a straight shape of the orientation flat 21*a* as the shape corresponding to the orientation flat 21*a*. In the example in FIG. 2, the whole jig 22 has an arched shape complementing a circle of the semiconductor wafer 21. The shape of the jig 22 is not limited to the shape in FIG. 2 as long as it has a shape corresponding to the orientation flat 21*a*.

The transport machine 2 transports the jig 22 so that the straight shape of the jig 22 faces the straight shape of the orientation flat 21*a* on the wafer table 1. Accordingly, the jig 22 is mounted on the wafer table 1.

The wafer ring 23 is mounted on the wafer table 1 manually or by the transport machine 2 or the other transport machine to surround the semiconductor wafer 21 and the jig 22 in a plan view. A material of the wafer ring 23 is stainless, for example.

The sticking roller 3 sticks the semiconductor wafer 21, the jig 22 facing the orientation flat 21*a*, and the wafer ring 23 surrounding the semiconductor wafer 21 and the jig 22 which are mounted on the wafer table 1 to the dicing tape 26. Specifically, the sticking roller 3 presses the dicing tape 26 fed by a feed machine not shown in the drawings against the semiconductor wafer 21, the jig 22, and the wafer ring 23, thereby sticking the dicing tape 26. The structure to be cut in FIG. 2 is thereby formed. A material of the sticking roller 3 is Si rubber, for example, and a material of the dicing tape 26 is UV curable polyolefin, for example.

The semiconductor wafer 21 of the structure to be cut in FIG. 2 is cut by a dicing blade similar to a dicing blade 8 in FIG. 3 described hereinafter, thus the semiconductor chip is cut out from the semiconductor wafer 21. In cutting the orientation flat 21*a*, the dicing blade cuts the orientation flat 21*a* along the straight shape of the orientation flat 21*a* while having contact with the jig 22.

Outline of Embodiment 1

According to the semiconductor manufacturing device according to the present embodiment 1 described above, the transport machine 2 transports the jig 22 so that the straight shape of the jig 22 faces the straight shape of the orientation flat 21*a* on the wafer table 1. According to such a configuration, the structure to be cut in which the semiconductor wafer 21 and the jig 22 are fixed to each other can be formed while the jig 22 faces the orientation flat 21*a* as illustrated in FIG. 2. Accordingly, one surface of the dicing blade cutting the orientation flat 21*a* receives force from the semiconductor wafer 21, and the other surface thereof receives force from the jig 22 in cutting the orientation flat 21*a*, thus unevenness of force applied on the dicing blade can be suppressed. As a result, breakage of the dicing blade can be suppressed.

Embodiment 2

Figure 3:
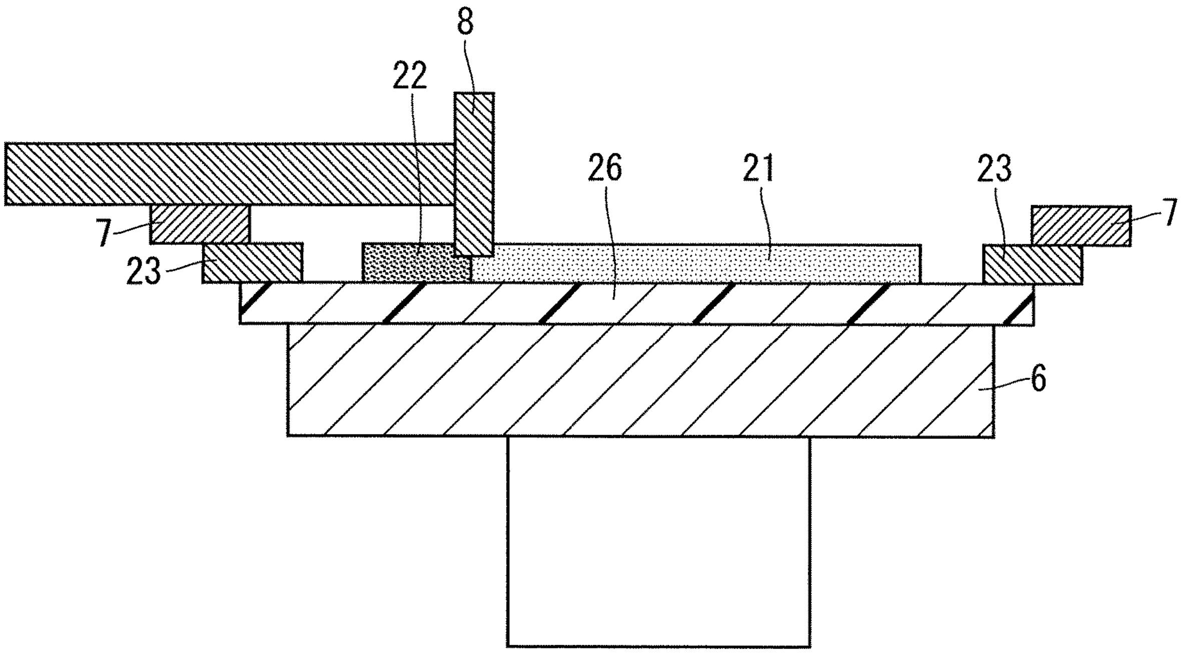
FIG. 3 is a schematic cross-sectional view illustrating a configuration of a dicing device according to the embodiment 1.

FIG. 3 is a schematic cross-sectional view illustrating a configuration of a dicing device including a semiconductor manufacturing device according to the present embodiment 2. The semiconductor manufacturing device of the dicing device in FIG. 3 includes a dicing table 6 as a stage and the transport machine 2. The dicing device in FIG. 3 includes not only the semiconductor manufacturing device but also a ring holding part 7 and the dicing blade 8.

The dicing table 6 is a stage on which the semiconductor wafer 21 and the jig 22 are fixed to each other by the dicing tape 26. In the present embodiment 2, the dicing tape 26 to which the semiconductor wafer 21 and the wafer ring 23 surrounding the semiconductor wafer 21 are stuck is mounted on the dicing table 6 manually or by the transport machine 2 or the other transport machine. A part of the dicing table 6 on which the semiconductor wafer 21 is mounted may be provided with a porous capable of performing air suction on the semiconductor wafer 21 via the dicing tape 26.

After the dicing tape 26 described above is mounted on the dicing table 6, the transport machine 2 transports the jig 22 so that the straight shape of the jig 22 faces the straight shape of the orientation flat 21*a* on the dicing table 6, thereby sticking the jig 22 to the dicing tape 26. The structure to be cut in FIG. 2 is thereby formed.

The semiconductor wafer 21 of the structure to be cut in FIG. 2 is cut by the dicing blade 8, thus the semiconductor chip is cut out from the semiconductor wafer 21. In cutting the orientation flat 21*a*, the dicing blade 8 cuts the orientation flat 21*a* along the straight shape of the orientation flat 21*a* while having contact with the jig 22. The dicing blade 8 is a blade made up of abrasive grains hardened by a bonding material, for example. The ring holding part 7 holds the wafer ring 23 while the dicing blade 8 performs cutting, thereby fixing the semiconductor wafer 21.

Outline of Embodiment 2

According to the semiconductor manufacturing device according to the present embodiment 2 described above, the transport machine 2 transports the jig 22 so that the straight shape of the jig 22 faces the straight shape of the orientation flat 21*a* on the wafer table 1. According to such a configuration, the structure to be cut in which the semiconductor wafer 21 and the jig 22 are fixed to each other can be formed while the jig 22 faces the orientation flat 21*a* as illustrated in FIG. 2. Accordingly, one surface of the dicing blade cutting the orientation flat 21*a* receives force from the semiconductor wafer 21, and the other surface thereof receives force from the jig 22 in cutting the orientation flat 21*a*, thus unevenness of force applied on the dicing blade can be suppressed. As a result, breakage of the dicing blade can be suppressed.

Modification Example

In the description in the embodiment 1 and the embodiment 2, the jig 22 is transported by the transport machine 2. The configuration is not limited thereto, however, the jig 22 may be manually transported so that the straight shape of the jig 22 faces the straight shape of the orientation flat 21*a*.

The semiconductor wafer 21, for example, is stuck to the dicing tape 26 after being mounted on the wafer table 1 in the embodiment 1, and the jig 22 is stuck to the dicing tape 26 after the dicing tape 26, for example, is mounted on the dicing table 6 in the embodiment 2. However, the operation in the embodiment 1 and the operation of the embodiment 2 may be replaced with each other. That is to say, it is also applicable that the jig 22 is stuck to the dicing tape 26 after the dicing tape 26, for example, is mounted on the wafer table 1 in the embodiment 1, and the semiconductor wafer 21, for example, is stuck to the dicing tape 26 after being mounted on the dicing table 6 in the embodiment 2.

Embodiment 3

In the present embodiment 3, a material of the jig 22 and a material of the semiconductor wafer 21 are the same as each other in the embodiments 1 and 2. According to such a configuration, unevenness of force applied to the dicing blade can be further suppressed when the dicing blade 8 has contact with the orientation flat 21*a* compared with a case where materials of the semiconductor wafer 21 and the jig 22 are different from each other.

Embodiment 4

In the present embodiment 4, a thickness of the jig 22 and a thickness of the semiconductor wafer 21 are the same as each other in the embodiments 1 and 2. The state where the thickness of the jig 22 and the thickness of the semiconductor wafer 21 are the same as each other includes a state where a difference between the thickness of the jig 22 and the thickness of the semiconductor wafer 21 is equal to or smaller than 5% of a thickness of one of the jig 22 and the semiconductor wafer 21 larger than that of the other one thereof. According to such a configuration, unevenness of force applied to the dicing blade can be further suppressed when the dicing blade 8 has contact with the orientation flat 21*a* compared with a case where thicknesses of the semiconductor wafer 21 and the jig 22 are different from each other.

Modification Example

The configuration of the embodiment 3 may be combined with the configuration of the embodiment 4. That is to say, in the embodiments 1 and 2, it is applicable that the material of the jig 22 and the material of the semiconductor wafer 21 are the same as each other, and the thickness of the jig 22 and the thickness of the semiconductor wafer 21 are the same as each other. According to such a configuration, unevenness of force applied to the dicing blade can be further suppressed when the dicing blade 8 has contact with the orientation flat 21*a* compared with a case where thicknesses of the semiconductor wafer 21 and the jig 22 are different from each other.

Embodiment 5

In the present embodiment 5, the transport machine 2 transports the jig 22 so that a gap is located between the jig 22 and the orientation flat 21*a* in the embodiments 1 and 2. According to such a configuration, abrasion of the dicing blade 8 can be suppressed, thus increase in lifetime of the dicing blade 8 can be expected. The configuration of the present embodiment 5 may be combined with at least one of the configuration of the embodiment 3 and/or the configuration of the embodiment 4.

Each embodiment and each modification example can be arbitrarily combined, or each embodiment and each modification can be appropriately varied or omitted.

The aspects of the present disclosure are collectively described hereinafter as appendixes.

APPENDIX 1

A semiconductor manufacturing device, comprising:

a stage on which a semiconductor wafer including an orientation flat and a jig having a shape corresponding to the orientation flat to be used for cutting the orientation flat by a dicing blade are fixed to each other by a dicing tape; and a transport machine transporting the jig so that the jig faces the orientation flat on the stage.

APPENDIX 2

A wafer mounting device, comprising:

the semiconductor manufacturing device according to Appendix 1; and a tape sticking part sticking the semiconductor wafer, the jig 22 facing the orientation flat, and a wafer ring surrounding the semiconductor wafer and the jig which are mounted on the stage to the dicing tape.

APPENDIX 3

A dicing device, comprising:

the semiconductor manufacturing device according to Appendix 1; and the dicing blade, wherein the transport machine transports and sticks the jig to the dicing tape to which the semiconductor wafer and a wafer ring surrounding the semiconductor wafer are stuck and which is mounted on the stage, and the dicing blade cuts the orientation flat along the orientation flat while having contact with the jig.

APPENDIX 4

The semiconductor manufacturing device according to any one of Appendixes 1 to 3, wherein a material of the jig and a material of the semiconductor wafer are a same as each other.

APPENDIX 5

The semiconductor manufacturing device according to any one of Appendixes 1 to 4, wherein a thickness of the jig and a thickness of the semiconductor wafer are a same as each other.

APPENDIX 6

The semiconductor manufacturing device according to any one of Appendixes 1 to 5, wherein the transport machine transports the jig so that a gap is located between the jig and the orientation flat.

APPENDIX 7

A semiconductor manufacturing method, comprising:

preparing a semiconductor wafer including an orientation flat and a jig having a shape corresponding to the orientation flat to be used for cutting the orientation flat by a dicing blade; and transporting the jig so that the jig faces the orientation flat on a stage on which the semiconductor wafer and the jig are fixed to each other by a dicing tape.

While the invention has been shown and described in detail, the foregoing description is in all aspects illustrative and not restrictive. It is therefore understood that numerous modifications and variations can be devised without departing from the scope of the invention.

What is claimed is:

1. A semiconductor manufacturing system, comprising:

a jig;

a stage on which a semiconductor wafer and the jig are fixed to each other by a dicing tape, the semiconductor wafer including an orientation flat, the jig having a shape corresponding to the orientation flat, the jig to be used for cutting the semiconductor wafer along the orientation flat by a dicing blade; and a transport machine configured to transport the jig so that the jig faces the orientation flat on the stage.

2. A wafer mounting system, comprising:

the semiconductor manufacturing device according to claim 1; and a tape sticking part configured to stick the semiconductor wafer, the jig facing the orientation flat, and a wafer ring surrounding the semiconductor wafer and the jig which are mounted on the stage to the dicing tape.

3. A dicing system, comprising:

the semiconductor manufacturing device according to claim 1; and the dicing blade, wherein the transport machine is configured to transport and stick the jig to the dicing tape to which the semiconductor wafer and a wafer ring surrounding the semiconductor wafer are stuck and which is mounted on the stage, and the dicing blade is configured to cut the semiconductor wafer along the orientation flat while having contact with the jig.

4. The semiconductor manufacturing system according to claim 1, wherein a material of the jig and a material of the semiconductor wafer are a same as each other.

5. The semiconductor manufacturing system according to claim 4, wherein a thickness of the jig and a thickness of the semiconductor wafer are a same as each other.

6. The semiconductor manufacturing system according to claim 1, wherein a thickness of the jig and a thickness of the semiconductor wafer are a same as each other.

7. The semiconductor manufacturing system according to claim 1, wherein the transport machine is configured to transport the jig so that a gap is located between the jig and the orientation flat.

8. The semiconductor manufacturing system according to claim 1, wherein the jig includes a side having a straight shape that extends along the orientation flat.

9. The semiconductor manufacturing system according to claim 8, wherein the straight side is substantially parallel to the orientation flat.

10. The semiconductor manufacturing system according to claim 8, wherein the straight side contacts the orientation flat.

11. The semiconductor manufacturing system according to claim 8, wherein the jig is spaced from the semiconductor wafer and the straight side is spaced from the orientation flat.

12. The semiconductor manufacturing system according to claim 8, wherein a length of the straight side is substantially equal to a length of the orientation flat.

13. The semiconductor manufacturing system according to claim 1, wherein a length of the jig is substantially equal to a length of the orientation flat.

* * * * *